US012595549B2

(12) United States Patent
Ockenfuss et al.

(10) Patent No.: US 12,595,549 B2
(45) Date of Patent: Apr. 7, 2026

(54) OPTICAL FILTER INCLUDING A HIGH REFRACTIVE INDEX MATERIAL

(71) Applicant: VIAVI SOLUTIONS INC., San Jose, CA (US)

(72) Inventors: Georg Ockenfuss, Santa Rosa, CA (US); Markus Bilger, Santa Rosa, CA (US); Marius Grigonis, Santa Rosa, CA (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 679 days.

(21) Appl. No.: 16/698,569

(22) Filed: Nov. 27, 2019

(65) Prior Publication Data

US 2020/0096675 A1 Mar. 26, 2020

Related U.S. Application Data

(62) Division of application No. 15/620,723, filed on Jun. 12, 2017, now abandoned.

(Continued)

(51) Int. Cl.
*C23C 14/34* (2006.01)
*C23C 14/06* (2006.01)
(Continued)

(52) U.S. Cl.
CPC ...... *C23C 14/3464* (2013.01); *C23C 14/0635* (2013.01); *C23C 14/083* (2013.01); *C23C 14/3457* (2013.01); *C23C 14/5806* (2013.01); *G01N 21/17* (2013.01); *G01N 2021/3568* (2013.01); *G02B 1/115* (2013.01);
(Continued)

(58) Field of Classification Search
CPC ............ C23C 14/3464; C23C 14/0635; C23C 14/083; C23C 14/3457; C23C 14/5806; G01N 21/17; G01N 2021/3568; G02B 1/115; G02B 1/14; G02B 5/1809; G02B 5/20; G02B 5/208; G02B 5/285; G02B 5/3066
See application file for complete search history.

(56) References Cited

U.S. PATENT DOCUMENTS

| | | | |
|---|---|---|---|
| 2,281,474 A | 4/1942 | Cartwright | |
| 4,431,562 A * | 2/1984 | Hiraki | C01B 3/0084 |
| | | | 423/658.2 |

(Continued)

FOREIGN PATENT DOCUMENTS

| | | |
|---|---|---|
| CN | 101276005 | 10/2008 |
| CN | 101421641 | 4/2009 |

(Continued)

OTHER PUBLICATIONS

JP-2017057487-A Translation (Year: 2017).*

(Continued)

*Primary Examiner* — Patrick S Ott
(74) *Attorney, Agent, or Firm* — Mannava & Kang, P.C.

(57) ABSTRACT

An optical filter including at least one of a high refractive index material and a low refractive index material; wherein the optical filter exhibits a reduced angle shift in at least one of a visible, near infrared, and an extreme ultraviolet wavelength is disclosed. A method of depositing a film is also disclosed.

16 Claims, 16 Drawing Sheets

Related U.S. Application Data

(60) Provisional application No. 62/349,406, filed on Jun. 13, 2016.

(51) Int. Cl.

| | |
|---|---|
| *C23C 14/08* | (2006.01) |
| *C23C 14/58* | (2006.01) |
| *G01N 21/17* | (2006.01) |
| *G02B 1/14* | (2015.01) |
| *G01N 21/3563* | (2014.01) |
| *G02B 1/115* | (2015.01) |
| *G02B 5/18* | (2006.01) |
| *G02B 5/20* | (2006.01) |
| *G02B 5/28* | (2006.01) |
| *G02B 5/30* | (2006.01) |

(52) U.S. Cl.
CPC .............. *G02B 1/14* (2015.01); *G02B 5/1809* (2013.01); *G02B 5/20* (2013.01); *G02B 5/208* (2013.01); *G02B 5/285* (2013.01); *G02B 5/3066* (2013.01)

(56) References Cited

U.S. PATENT DOCUMENTS

| | | | | |
|---|---|---|---|---|
| 4,887,886 | A * | 12/1989 | Shimizu | C23C 30/00 428/704 |
| 5,190,631 | A * | 3/1993 | Windischmann | C23C 14/0635 204/192.15 |
| 5,433,988 | A | 7/1995 | Fukuda et al. | |
| 6,426,311 | B1 | 7/2002 | Goto et al. | |
| 9,359,261 | B2 | 6/2016 | Bellman et al. | |
| 2002/0096684 | A1 * | 7/2002 | Brandes | H01L 31/03765 257/E31.049 |
| 2002/0192371 | A1 | 12/2002 | Veerasamy et al. | |
| 2003/0116270 | A1 | 6/2003 | Hawa et al. | |
| 2004/0121134 | A1 | 6/2004 | Bijkerk et al. | |
| 2004/0216992 | A1 * | 11/2004 | Ando | C23C 14/225 204/192.12 |
| 2004/0256215 | A1 * | 12/2004 | Stebbins | H01J 37/34 204/192.1 |
| 2005/0017995 | A1 | 1/2005 | Pferrer | |
| 2006/0141272 | A1 | 6/2006 | Wolfe | |
| 2006/0165963 | A1 | 7/2006 | Fleury et al. | |
| 2007/0188871 | A1 | 8/2007 | Fleury et al. | |
| 2007/0210265 | A1 | 9/2007 | Haq et al. | |
| 2009/0092772 | A1 | 4/2009 | Chang et al. | |
| 2009/0301864 | A1 * | 12/2009 | Ohmi | H01L 21/02606 204/192.15 |
| 2012/0019767 | A1 | 1/2012 | Cadet et al. | |
| 2012/0162744 | A1 * | 6/2012 | Lee | G02F 1/153 359/273 |
| 2014/0205844 | A1 * | 7/2014 | Sugawara | C23C 14/0635 428/448 |
| 2014/0272298 | A1 | 9/2014 | Memering et al. | |
| 2015/0138638 | A1 | 5/2015 | Mashino et al. | |
| 2015/0309216 | A1 | 10/2015 | Fournand | |
| 2015/0355380 | A1 | 12/2015 | Apitz et al. | |
| 2016/0023941 | A1 | 1/2016 | Brown et al. | |
| 2016/0149058 | A1 | 5/2016 | Dradley, Jr. et al. | |
| 2016/0154254 | A1 | 6/2016 | Bolshakov | |
| 2016/0289821 | A1 * | 10/2016 | Nayak | G02B 1/10 |
| 2017/0357033 | A1 * | 12/2017 | Ockenfuss | C23C 14/0635 |
| 2017/0363777 | A1 | 12/2017 | Maeda | |
| 2018/0038995 | A1 | 2/2018 | Fujii | |
| 2018/0299700 | A1 | 10/2018 | Takashiba et al. | |

FOREIGN PATENT DOCUMENTS

| | | |
|---|---|---|
| CN | 107086222 | 8/2017 |
| EP | 2209023 | 7/2010 |
| EP | 2624020 | 8/2013 |
| EP | 2033019 B1 | 8/2016 |
| JP | S62-255829 | 11/1987 |
| JP | 2001295032 | 10/2001 |
| JP | 2001356201 | 12/2001 |
| JP | 2003045211 | 2/2003 |
| JP | 2003268211 | 9/2003 |
| JP | 2005531814 | 10/2005 |
| JP | 2006124417 | 5/2006 |
| JP | 2007250342 | 9/2007 |
| JP | 2007534007 | 11/2007 |
| JP | 2008280578 | 11/2008 |
| JP | 2010072616 | 4/2010 |
| JP | 2013512462 | 4/2013 |
| JP | 2013516638 | 5/2013 |
| JP | 2017057487 A * | 3/2017 |
| JP | 2017151219 | 8/2017 |
| KR | 10-2007-0084497 | 8/2007 |
| KR | 10-2009-0045648 | 5/2009 |
| WO | 2013151984 | 10/2013 |
| WO | 2015054724 A1 | 4/2015 |
| WO | 2013183457 | 1/2016 |
| WO | 2016129699 | 8/2016 |
| WO | 2017127734 | 7/2017 |

OTHER PUBLICATIONS

Kalomiros, et al., "Optical properties of a-SiC:H thin films grown by rf sputtering", 1994, Physical Review B, vol. 49, No. 12, pp. 8191-8197. (Year: 1994).*

Kim, et al., "Annealing Effect on the Optical Properties of a-SiC:H Films Deposited by PECVD", 2002, Materials Transactions, vol. 43, No. 8, pp. 2058-2062 (Year: 2002).*

Shogrin et al., "Spontaneous Dewetting of a Perfluoropolyether" NASA Technical Memorandum 106964, year 1995, 15 pages.

Singh et al., Optical constants of SiC (Silicon carbide), downloaded from RefractiveIndex.INFO, year 1971, 2 pages.

American Element, "Niobium-Titanium-Oxide", 2021. Downloaded from the Internet on Feb. 5, 2021, 8 pages. <https://www.americanelements.com/niobium-titanium-oxide>.

Narita et al., "Evaluation of Niobium Titanium Oxide thin films", Optical Interference Coatings (OIC) 2016, 3 pages.

* cited by examiner

*FIG. 16*

OPTICAL FILTER INCLUDING A HIGH REFRACTIVE INDEX MATERIAL

RELATED APPLICATION

This application is a Divisional of commonly assigned and co-pending U.S. patent application Ser. No. 15/620,723, filed Jun. 12, 2017, which claims the benefit of priority from U.S. Provisional Application No. 62/349,406, filed Jun. 13, 2016, the entire contents of which are incorporated by reference herein.

FIELD OF THE INVENTION

The present disclosure generally relates to an optical filter including at least one of a high refractive index material and a low refractive index material, wherein the optical filter exhibits a reduced angle shift in at least one of a visible, near infrared, and an extreme ultraviolet wavelength. A method of depositing a film, such as a film of an optical filter, is also disclosed herein.

BACKGROUND OF THE INVENTION

Silicon carbide (SiC) has a relatively high refractive index in the visible region. Additionally, silicon carbide is a ceramic that is known for its hard, strong and inert properties. It is commonly used in the abrasion refractory fields as a hard coat material. Silicon carbide films and coatings have been produced through chemical vapor deposition, sputtering (radio frequency (RF), primarily), sol gel coating or plasma spraying. In particular, silicon carbide has been sputtered with RF and ion beam processes from silicon carbide targets, however, rates are typically quite slow, usually single angstroms/sec. Reactive sputtering of silicon carbide has been performed using a silicon target with methane as the reactive gas.

SUMMARY OF THE INVENTION

In an aspect, there is disclosed an optical filter comprising at least one of a high refractive index material and a low refractive index material, wherein the optical filter exhibits a reduced angle shift in at least one of a visible, near infrared, and an extreme ultraviolet wavelength.

In another aspect, there is disclosed a method for depositing a film comprising (i) introducing, to a process chamber of a cathode sputter-deposition system, a first target including a high refractive index material; (ii) introducing at least one of argon gas and hydrogen gas into the process chamber; and (iii) depositing particles created from the first target on a substrate to form a film, wherein the film exhibits increased transmission of light at least one of the visible and near infrared wavelengths.

Additional features and advantages of various aspects of the invention will be set forth, in part, in the description that follows, and will, in part, be apparent from the description, or may be learned by the practice of various aspects. The objectives and other advantages of various aspects will be realized and attained by means of the elements and combinations particularly pointed out in the description herein.

BRIEF DESCRIPTION OF THE DRAWINGS

The present invention in its several aspects can be more fully understood from the detailed description and the accompanying drawings, wherein:

FIG. 16 is a graph showing VASE analysis of optical constants of 2 μm SiC film deposited on fused silica from SiC and Si targets with two cathode sputtering according to an example of the present disclosure;

Throughout this specification and figures like reference numbers identify like elements.

DETAILED DESCRIPTION OF THE INVENTION

Figure 1:
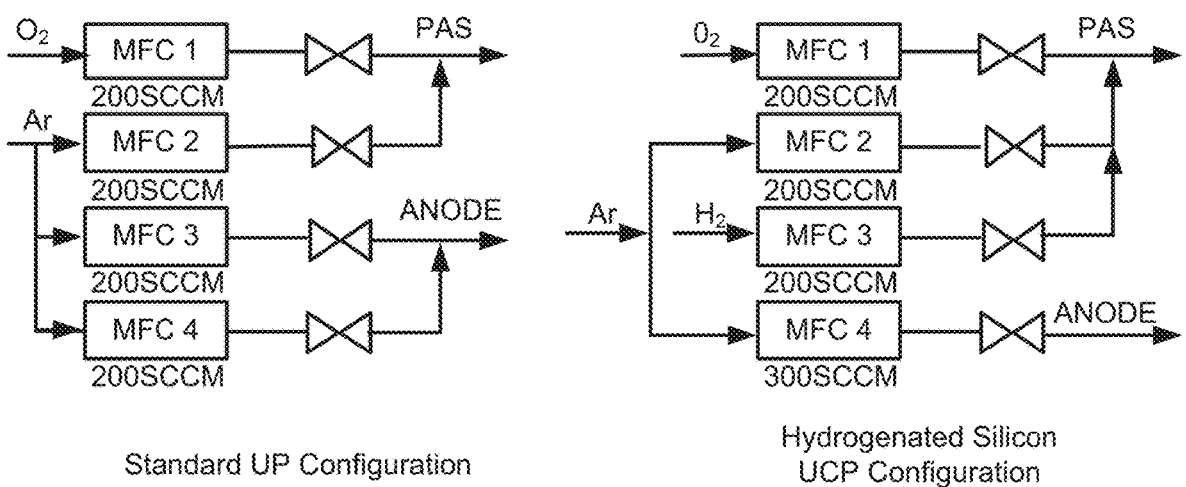
FIG. 1 is a gas flow configurations for UCP in standard and hydrogenated silicon setups according to an example of the present disclosure.

For simplicity and illustrative purposes, the present disclosure is described by referring mainly to examples thereof. In the following description, numerous specific details are set forth in order to provide a thorough understanding of the present disclosure. It will be readily apparent however, that the present disclosure may be practiced without limitation to these specific details. In other instances, some methods and structures readily understood by one of ordinary skill in the art have not been described in detail so as not to unnecessarily obscure the present disclosure.

For purposes of the present disclosure, the word "cathode" or "cathodes" include(s) one or more of a coating supply incorporated in the cathode, a coating supply positioned on the cathode, or a coating supply that also acts as the cathode. Additionally, for purposes of the present disclosure the word "cathode" and "target" may be used interchangeably.

Furthermore, numeric values and ranges herein, unless otherwise stated, are intended to have associated with them a tolerance and to account for variances of design and manufacturing. Thus, a number is intended to include values "about" that number. For example, a value X is also intended to be understood as "about X". Likewise, a range of Y-Z, is also intended to be understood as a range of from "about Y-about Z". Unless otherwise stated, significant digits disclosed for a number are not intended to make the number an exact limiting value. Variance and tolerance is inherent in mechanical design and the numbers disclosed herein are intended to be construed to allow for such factors (in non-limiting e.g., ±10 percent of a given value). Example numbers disclosed within ranges are intended also to disclose sub-ranges within a broader range which have an example number as an endpoint. A disclosure of any two example numbers which are within a broader range is also intended herein to disclose a range between such example numbers. Likewise, the claims are to be broadly construed in their recitations of numbers and ranges.

Aspects of the present disclosure include an optical filter comprising a high refractive index material and a low refractive index material, wherein the optical filter exhibits a reduced angle shift in a visible wavelength. In an aspect, the high refractive index material can be a silicon carbide having a refractive index of about 2.66. Silicon carbide can also be used in the extreme ultraviolet lithography (EUV) as a reflector material due to its high K (potentially greater than 2) value at wavelengths of about 50 nm to about 200 nm. In the near infrared range (800 nm to 1100 nm), silicon carbide can be used as a low index material to produce low angle shift filters for three-dimensional sensing applications.

A limitation for realizing optical filters with low or reduced angle shift in at least one of the visible, near infrared, and an extreme ultraviolet wavelength can be the availability of high refractive index materials. Non-limiting examples of materials having higher refractive indices are as follows with their corresponding refractive index (including their combinations):

| | n | | | k | | |
|---|---|---|---|---|---|---|
| | 425 nm | 550 nm | 950 nm | 425 nm | 550 nm | 950 nm |
| SiC | 2.74 | 2.66 | 2.59 | $3 \times 10^{-5}$ | $1 \times 10^{-5}$ | $1 \times 10^{-5}$ |
| TiO$_2$ | 2.90 | 2.64 | 2.49 | $7 \times 10^{-4}$ | $4 \times 10^{-4}$ | $3 \times 10^{-4}$ |

-continued

| | n | | | k | | |
|---|---|---|---|---|---|---|
| | 425 nm | 550 nm | 950 nm | 425 nm | 550 nm | 950 nm |
| Nb$_2$O$_5$ | 2.50 | 2.37 | 2.27 | $3.8 \times 10^{-4}$ | $9 \times 10^{-5}$ | $3 \times 10^{-5}$ |
| Ta$_2$O$_5$ | 2.25 | 2.18 | 211 | $1 \times 10^{-5}$ | $1 \times 10^{-5}$ | $1 \times 10^{-5}$ |

Non-limiting examples of low refractive index materials include SiO$_2$, MgF, Al$_2$O$_3$, and combinations thereof.

While it is possible to design optical filters with a high refractive index when using TiO$_2$ as a higher refractive index layer and Ta$_2$O$_5$ as a lower refractive index layer, the small difference in refractive index of these two materials (delta_n=0.29) may require a lot of layers in many designs, specifically bandpass filters which require extensive blocking. Additionally, TiO$_2$ may not be very easy to sputter because it grows polycrystalline which causes scatter loss in thicker coatings. In an aspect, the optical filter can include at least one layer, wherein a thickness of the optical filter is less than about 10 μm, for example less than about 9.0 μm, and as a further example less than about 8.5 μm.

The table below shows the summary of a design study of double bandpass design in the visible and NIR (wavelength shift at 800 nm of design for angles of incidence of 0 to 40 degrees).

| Coating materials | Wavelength shift | Thickness |
|---|---|---|
| NbTiOx/Al$_2$O$_3$ | 48.5 nm | 4.8 um |
| SiC/Ta$_2$O$_5$ | 33 nm | 10.0 um |
| SiC/(Ta$_2$O$_5$/SiO$_2$ mix) | 35 nm | 7.4 um |

The Ta$_2$O$_5$/SiO$_2$ mixture contains 80% Ta$_2$O$_5$ and 20% SiO$_2$. This reduces the refractive index of Ta$_2$O$_5$ from 2.18 to 2.04 and thus increases the delta_n from 0.48 to 0.62. This allows for a thinner filter design.

In an aspect, the optical filter can include a high refractive index material, such as silicon carbide, having a thickness of from about 1 nm to about 2000 nm, for example from about 2 nm to 1000 nm, such as from about 3 nm to about 20 nm or from about 5 nm to about 20 nm. This range of thickness can provide light transmission in a visible wavelength. Moreover, the method of depositing the high refractive index material, such as a SiC layer, can play a part in the performance of the optical filter.

In an aspect, the high refractive index material can be deposited on any substrate, such as a wafer, or optical element and can be deposited by a method that would allow very precise thickness control. For example, a thickness of the optical filter, for example a film formed of a high refractive index material, can be reduced by using a material with a higher refractive index. Such a method can include different sputtering process systems, such as dual cathode sputtering process and single cathode sputtering process.

The optical properties of the SiC layer can depend on the hydrogen content in the process chamber and, therefore, on the hydrogen flow rate. However, the optical properties of the SiC layer can also be influenced by other parameters, such as the flow rate of an inert gas, the PAS power level, the cathode power level, and the deposition rate.

The process parameters and values can vary depending on the coating process, chamber size, and many other factors. Generally, the temperature of the process chamber can be from 10° C. or less to 150° C. or more, such as from 15° C. to 100° C. or from 20° C. to 90° C. Furthermore, the pressure of the process chamber can be from $1\times10^{-6}$ mtorr to $1\times10^{-2}$ mtorr, such as from $5\times10^{-3}$ mtorr to $5\times10^{-4}$ mtorr. Moreover, the gas flow, such as the hydrogen and/or the argon gas flow, can be from 10 SCCM or less to 200 SCCM or more, such as 20 SCCM, 40 SCCM, 60 SCCM, 80 SCCM, 100 SCCM, 120 SCCM, 140 SCCM, 160 SCCM, 180 SCCM, and 200 SCCM. Furthermore, the inert gas, such as argon gas, flow can be from 50 SCCM to 500, for example, 150 SCCM or more, such as 200 SCCM, 204 SCCM, 295 SCCM, and 390 SCCM.

In an aspect, a method of depositing a film, for example for use in an optical filter, can include introducing, to a process chamber of a cathode sputter-deposition system, a first target including a high refractive index material. The high refractive index material is selected from $TiO_2$, $Nb_2O_5$, SiC, $Ta_2O_5$, and combinations thereof. In an aspect, the high refractive index material is silicon carbide. In another aspect, the method can further include introducing into the process chamber a second target including silicon.

The method can further include introducing at least one of argon gas and hydrogen gas into the process chamber. In an aspect, argon gas is the only gas introduced into the process chamber. In another aspect, hydrogen gas is the only gas introduced into the process chamber. In a further aspect, both argon gas and hydrogen gas are introduced into the process chamber. The hydrogen gas can be introduced in an amount ranging from about 0 SCCM to about 100 SCCM, for example from about 20 SCCM to about 80 SCCM, for example from about 40 SCCM to about 60 SCCM.

The method can further include depositing particle created from the first target onto a substrate, such as those disclosed above, to form a film, wherein the film can exhibit increased transmission of light in at least one of the visible and near infrared wavelengths. In an aspect, the film can exhibit increased transmission of light in the visible wavelength.

In an aspect, the method can further include tilting a cathode exchanger in the cathode sputter-deposition system to a tilt angle selected from the group consisting of 30°, 35°, 40°, and 45°. Tilting of the cathode exchanger to a tilt angle ranging from 0° to about 30° can increase light transmission of the film.

To deposit the high refractive index material, a first target can include silicon carbide, and a second target can include silicon. These two targets can be sputtered in the presence of hydrogen ($H_2$), and a cathode exchanger tilt angle ranging from about 0° to about 30° to deposit the SiC material as a layer on the substrate or on a layer previously deposited on the substrate.

In an aspect, the method can include depositing particles created from the sputtering of a third target and/or a fourth target having a lower refractive index material onto the film. The layers of high and low refractive index materials can alternate a predetermined number of times. Depending on the desired number of layers with the compound having the lower refractive index and the number of layers with the compound having the higher refractive index, this process can be repeated as many times as necessary.

The final product can be annealed. The method can further include annealing the film to the substrate so that the annealed film can exhibit an increased transmission of light in the near infrared wavelength. The annealing temperature can be at any temperature greater than 90° C. For example, the annealing can take place at a temperature of 100° C., 200° C., 250° C., 280° C., 300° C., 350° C., 400° C., or more. The annealing process can take anywhere from 30 minutes to 24 hours. For example, the annealing process can take from 40 minutes to 10 hours, from 45 minutes to 5 hours, from 50 minutes to 2 hours, such as an hour. In one example, the annealing process takes place at a temperature of about 280° C. for about 1 hour. The annealed film can exhibit increased transmission of light in the near infrared wavelength.

EXAMPLES

A SiC target from Saint-Gobain Advanced Ceramics was used for this experiment. The target (Hexoloy SG silicon carbide) was an electrically conductive sintered SiC target with a density of 3.0 g/cm3. The target contained 5.35% by weight free carbon. Saint-Gobain claims an electrical resistivity of 1.0 ohm-cm and a target porosity of 2-3%. The SiC films were deposited in the UCP machine M2105. All films were deposited at a frequency of 30 kHz, a reversal time of 4.5 μs and a cathode power of 5 kW unless otherwise stated. This resulted in a cathode voltage of about 600V, depending on gas flows. The flow of Ar and $H_2$ were varied to determine the best deposition conditions. Using the optimized parameters a single layer film was deposited for characterization in the material characterization lab (MCL). MCL characterization included stoichiometry, n and k values, hardness, film stress and surface roughness. Also, the SiC films were deposited by co-sputtering from two cathodes, using SiC and Si targets. Through the course of film characterization, Cu contamination was identified in the SiC coatings. A set of experiments was performed to identify the source of the contamination as the center puck of the cathode, as described below.

Effects of Ar Gas Flow

Figure 2:
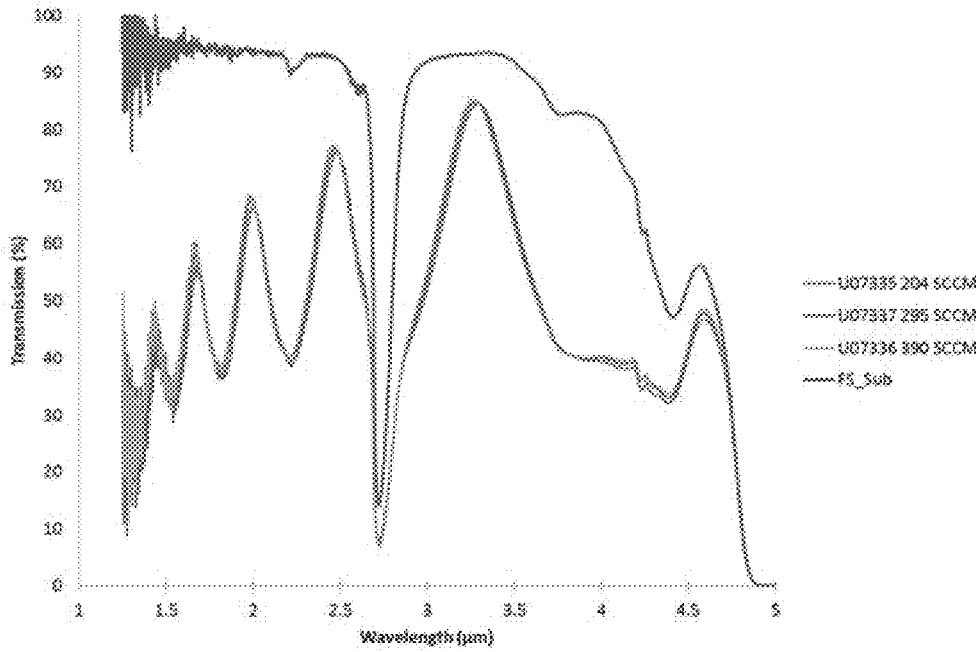
FIG. 2 is a graph showing the transmission measurements of 2 μm thick SiC films deposited on fused silica with varying Ar flows according to an example of the present disclosure.
Figure 3:
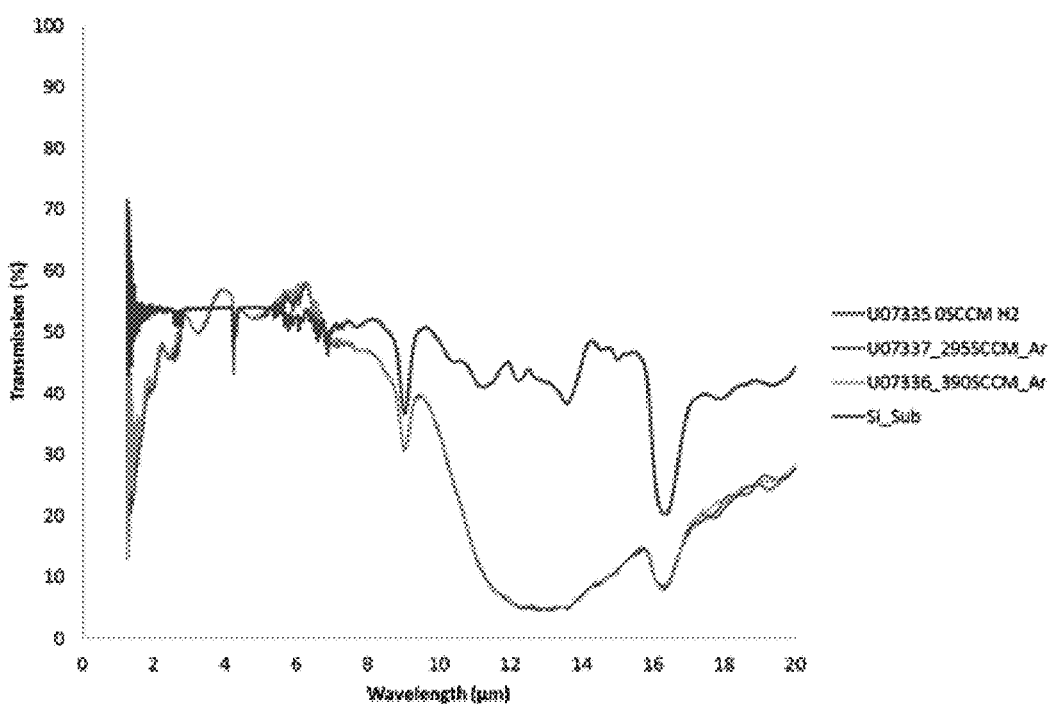
FIG. 3 is a graph showing the transmission measurements of 2 μm thick SiC films deposited on Si with varying total Ar flows according to an example of the present disclosure.

The first set of experiments looked at the effect of Ar gas flow on the transmission of 2 μm SiC films. Table 2 summarizes the Argon flow parameters used for the tests. FIG. 1 is a comparison schematic of the standard and hydrogenated gas flows for UCP. Transmission measurements from 1.25 μm-5 μm of three runs on fused silica with different Ar gas flow rates (204 SCCM, 295 SCCM, and 390 SCCM) are shown in FIG. 2. FIG. 3 shows the performance of the same coating runs deposited on Si witnessed and scanned from 1.5-20 μms. The absorption between 11-14 μms was due to Si—C bonds and was present in all scans. This test determined that Ar flow had little effect on the transmission of the SiC films. 148 SCCM Ar was selected through the anode and 56 SCCM through the PAS as the default Ar flow values for the experiments.

TABLE 2

| Run | Thickness (nm) | Dep Rate (nm/s) | Anode (SCCM) | PAS (SCCM) | Total (SCCM) |
|---|---|---|---|---|---|
| U07335 | 2000 | 0.43 | 148 | 56 | 204 |
| U07336 | 2000 | 0.43 | 295 | 95 | 390 |
| U07337 | 2000 | 0.43 | 200 | 95 | 295 |

Effects of $H_2$ Gas Flow

Figure 4:
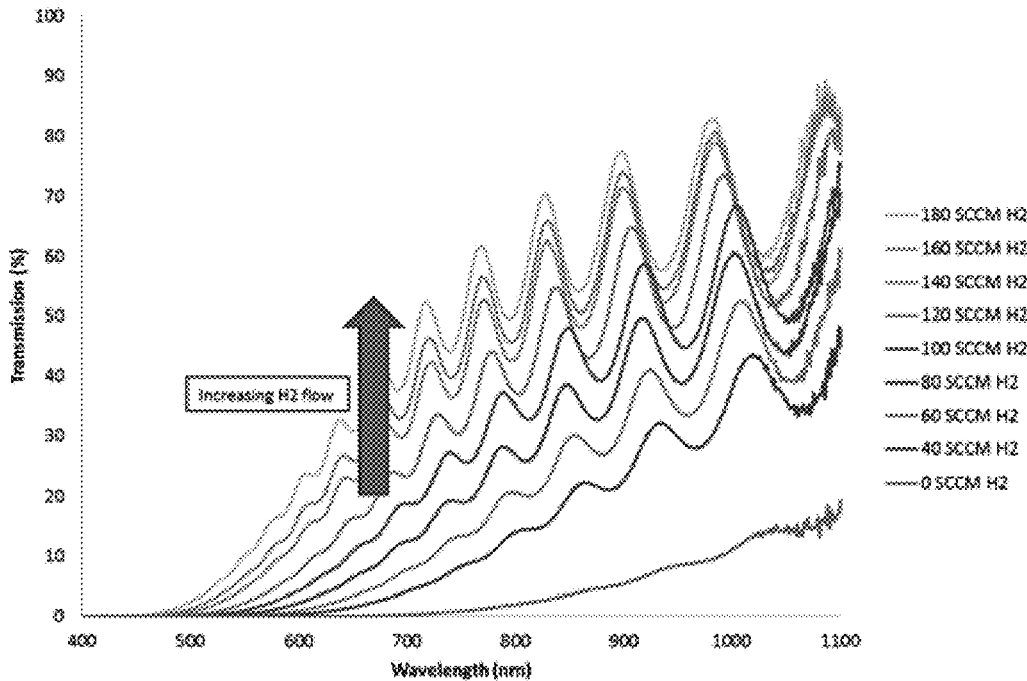
FIG. 4 is a graph showing the transmission measurements of 2 μm thick SiC films deposited on fused silica with increasing $H_2$ flows according to an example of the present disclosure.

As shown in FIG. 2 the transmission of the films dropped off sharply around 1000 nm and as shown in FIG. 4, the films were fully absorbing around 800 nm (transmission measurement of 0 SCCM $H_2$). Adding hydrogen to the sputtering process shifted the absorption edge to lower values. Because of this fact and the lack of transmission in the visible range, hydrogen was added to the sputtering process. Due to the previous Si work in M2105 for near infrared applications, this UCP platform was equipped with a $H_2$ generator and delivery system. The setup with the hydrogenated gas flow configuration is shown in FIG. 1 and was used for the experiments. Table 3 summarizes the $H_2$ flows for the SiC films deposited in this set of experiments and included whether or not the film delaminated or not. All films were deposited with an Ar flow of 204 SCCM.

TABLE 3

| Run | Thickness (nm) | $H_2$ flow (SCCM) | Delaminated (Y/N?) |
|-----|---------------|-------------------|--------------------|
| U07338 | 2000 | 40 | N |
| U07339 | 2000 | 60 | N |
| U07340 | 2000 | 80 | N |
| U07341 | 2000 | 100 | N |
| U07342 | 2000 | 120 | Y |
| U07343 | 2000 | 140 | Y |
| U07344 | 2000 | 160 | Y |
| U07345 | 2000 | 180 | Y |

Figure 5:
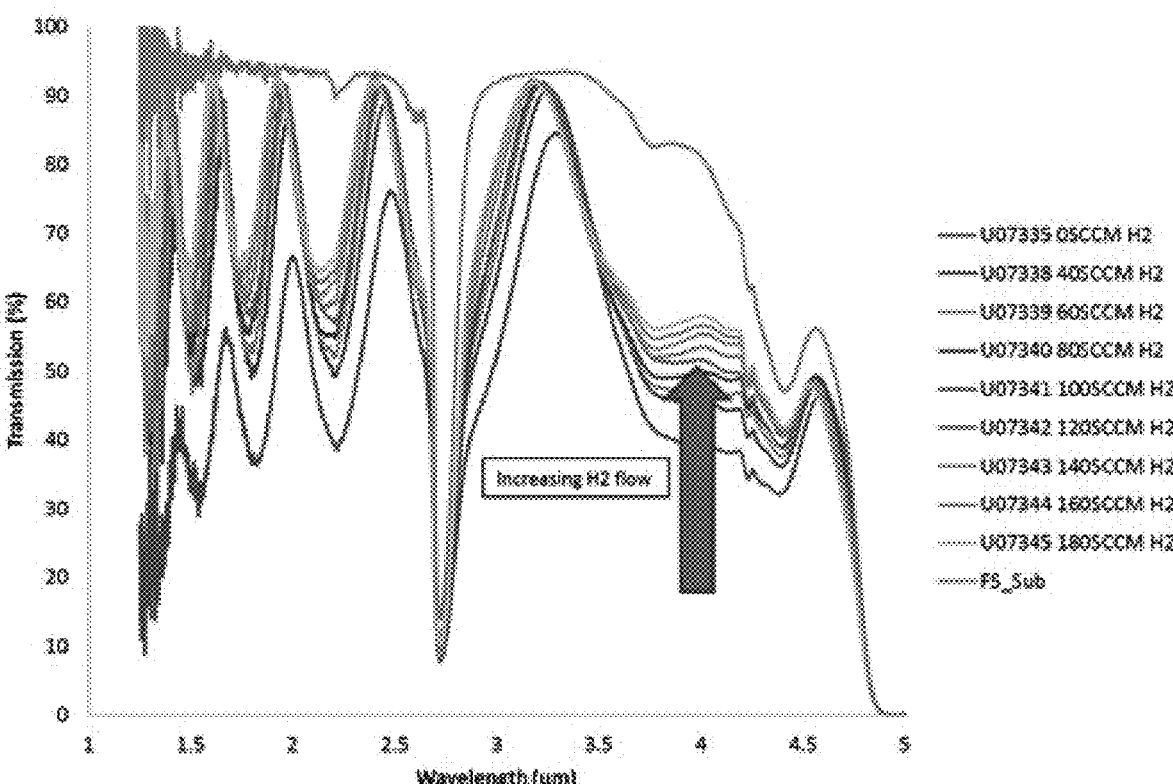
FIG. 5 is a graph showing the transmission measurements of 2 μm thick SiC films deposited on fused silica with increasing $H_2$ flows according to an example of the present disclosure.
Figure 6:
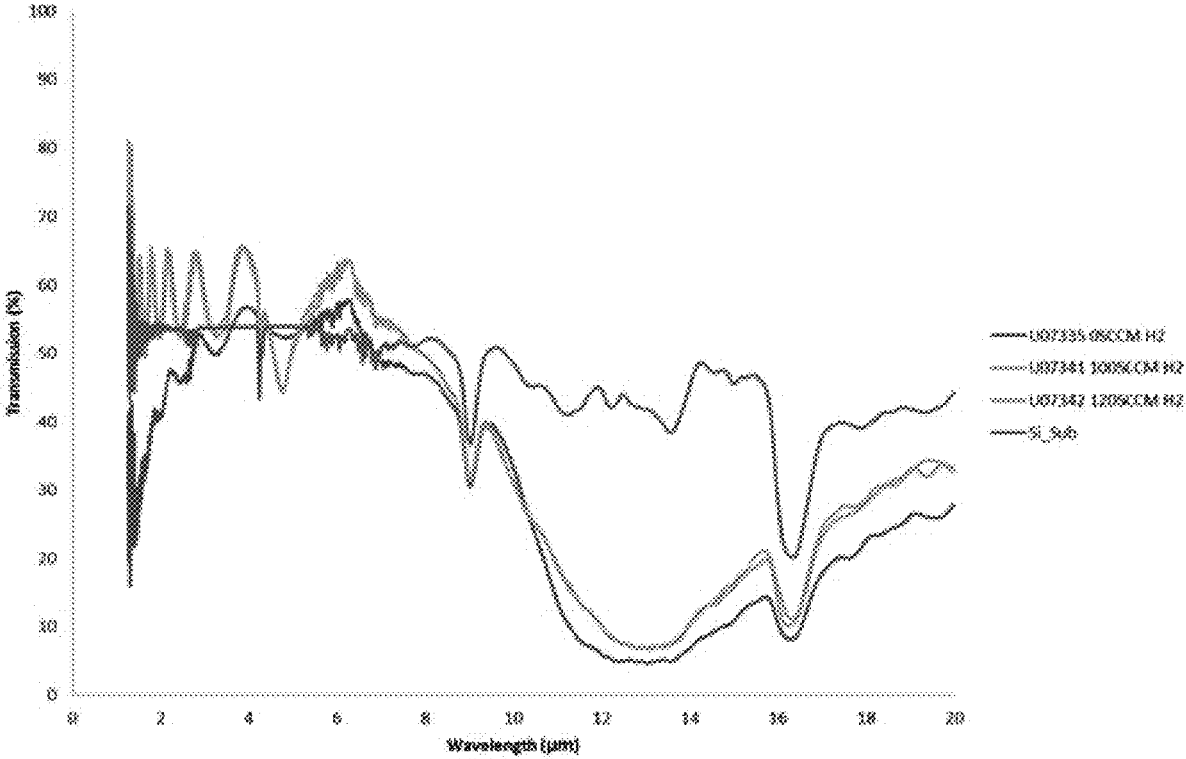
FIG. 6 is a graph showing the transmission measurements of 2 μm thick SiC films deposited on Si with increasing $H_2$ flows according to an example of the present disclosure.

As the $H_2$ flow increased beyond 100 SCCM, the SiC films delaminated. Films deposited at 160 SCCM and 180 SCCM of $H_2$ delaminated from Si and Ge witnesses immediately after removal from the coating chamber and from fused silica witnesses within a week. Films deposited at 140 SCCM of $H_2$ delaminated within two days of coating from Si and Ge witnesses and from fused silica witnesses within a week. Films deposited with 120 SCCM of $H_2$ delaminated from Si and Ge witnesses within two weeks of coating with the films delaminating from fused silica within three-four weeks of coating. Transmission scans of these films are shown in FIGS. 4, 5, and 6.

Adding $H_2$ to the sputtering process increased the transmission of the deposited SiC films significantly between 1-4 μm. As shown in FIGS. 4 and 5, increasing the $H_2$ gas flow increased the transmission of the films. SiC coatings with more than 100 SCCM Hz were delaminating. The addition of Hz to the process gas did not increase the transmission of the films below 700 nm to a level needed for use in this wavelength region. The addition of Hz increased the transmission of the films in the 850 nm-1100 nm region. The increase in transmission was negligible for wavelengths greater than 4 μm for all values of Hz flow, as shown in FIGS. 5 and 6. Absorption at 11-14 μm was still present even with added hydrogen. The absorption present in the IR scans around 5 μm was due to Si—H and Si—$H_2$ bonds.

Figure 7:
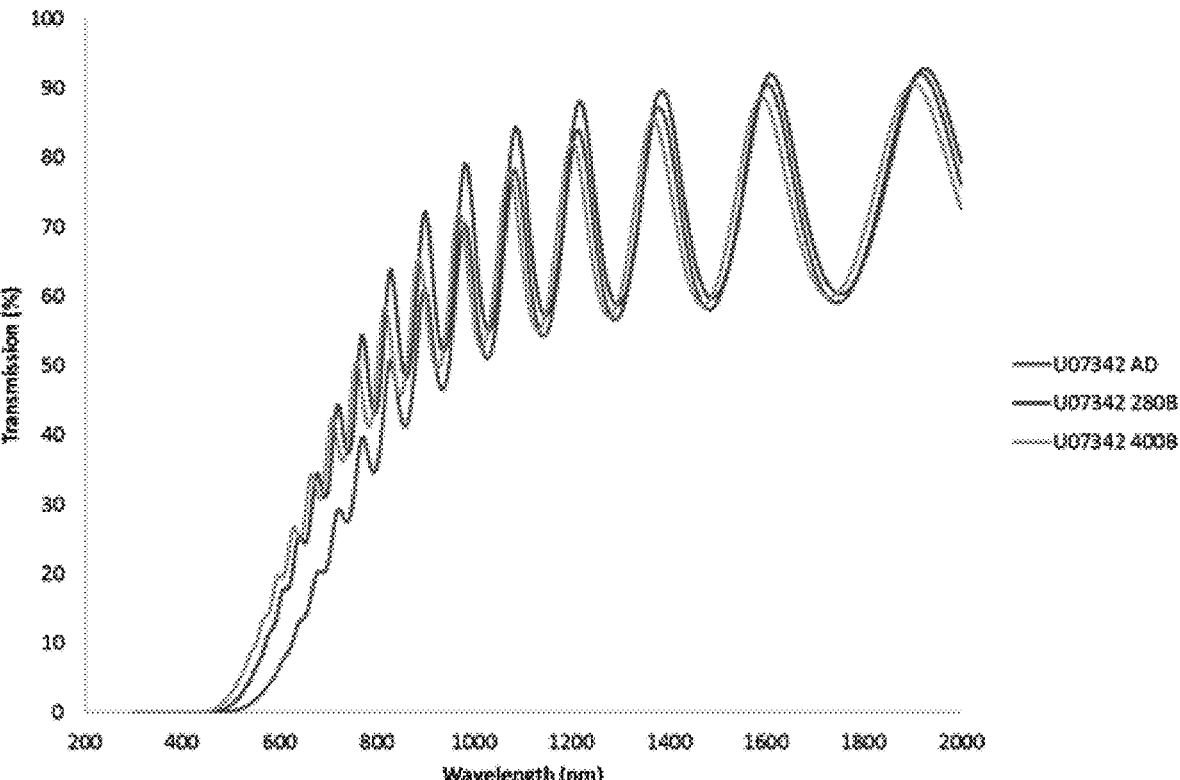
FIG. 7 is a graph showing 120 SCCM H2 flow SiC film as deposited, after 1 hr. at 280° C. bake, and 1 hr. at 400° C. bake according to an example of the present disclosure.

To test the effect of annealing on the absorption of the SiC films, a SiC film was deposited on a fused silica substrates with 120 SCCM Hz. After deposition, the coatings were annealed at 280 and 400° C. for 1 hour. The film delaminated from the substrates 2 days after annealing. The scans of the films before and after annealing are shown in FIG. 7. Annealing of the films provided little improvement in the visible and LWIR wavelengths, but did improve the transmission of the films in the near infrared region.

Materials Characterization Lab Analysis

Figure 8:
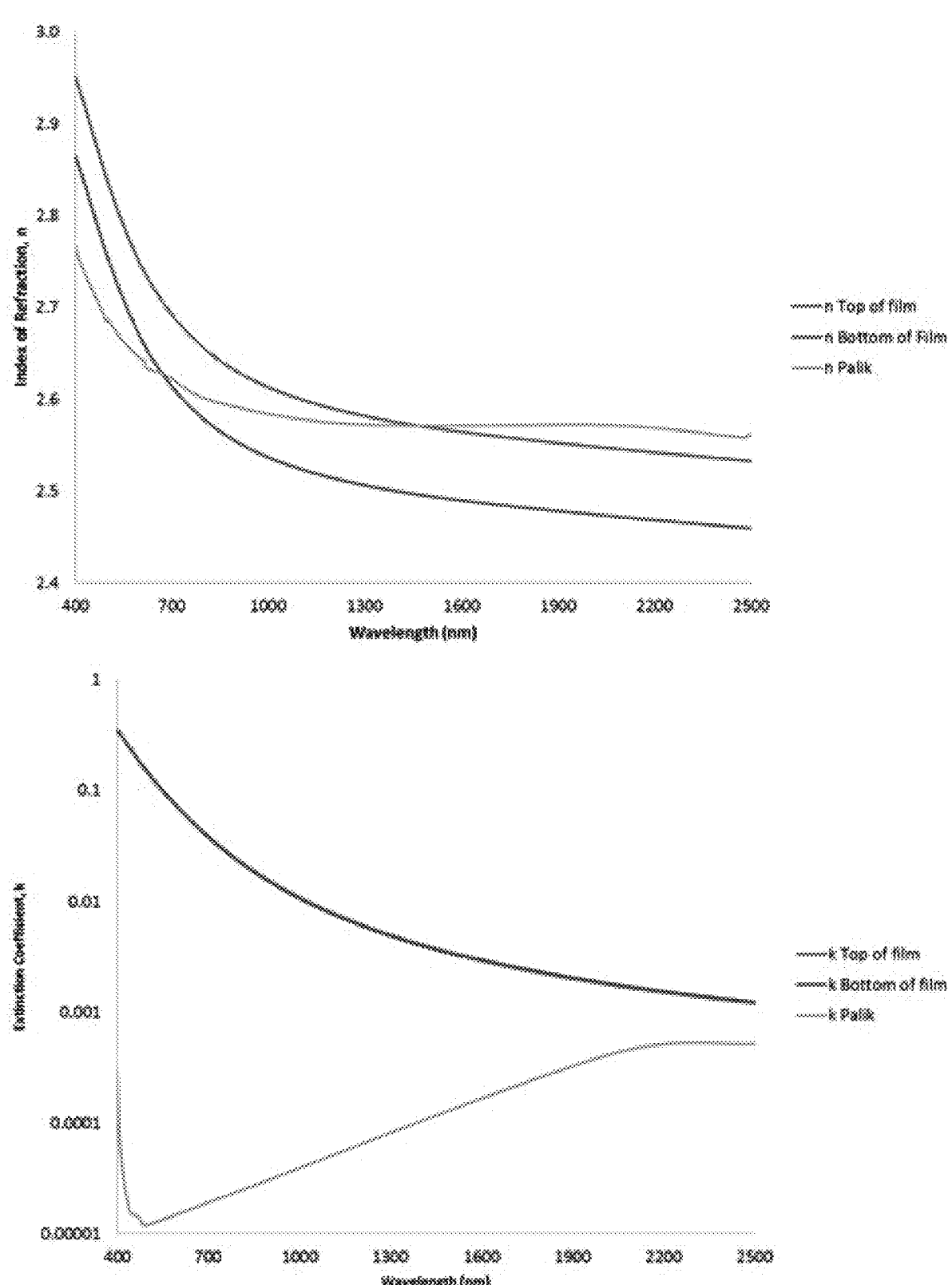
FIG. 8 is a graph showing VASE analysis of optical constants of 2 μm thick SiC films deposited on fused silica according to an example of the present disclosure.

Included in several of the aforementioned runs were different witnesses for MCL analysis. A 2 μm SiC sample was deposited on fused silica for variable angle spectroscopic ellipsometry (VASE) testing. A graph of the calculated optical constants is shown in FIG. 8, as well as a depth profile of the optical constants. FIG. 8 includes SiC n and k values from E. Palik, *Handbook of Optical Constants of Solids*, Academic Press, 1985, for crystalline SiC. The measured refractive index has a 3% gradient perpendicular to the substrate. These values were confirmed with the deposition of thinner films. The refractive index increases with film thickness. The origin of this index gradient is unknown. TEM analysis of the substrate/film and film/air interface did not reveal any morphological differences. The refractive index of the film was measured to be 2.95 at 400 nm and 2.55 at 2500 nm and the extinction coefficient was measured to be 0.15 at 500 nm and 0.00152 at 2500 nm. The refractive index values were within 10% of the bulk values reported by Palik, but the extinction coefficient values differ by several orders of magnitude.

A possibility for the linear index gradient could be contamination of the SiC film with copper. Cu contamination was discovered in the first set of experiments. Films measured after the removal of the Cu contamination source did not show this linear index gradient. It is believed that this Cu contamination also led to the differences in the reported and measured extinction values.

EDS Analysis

Figure 9:
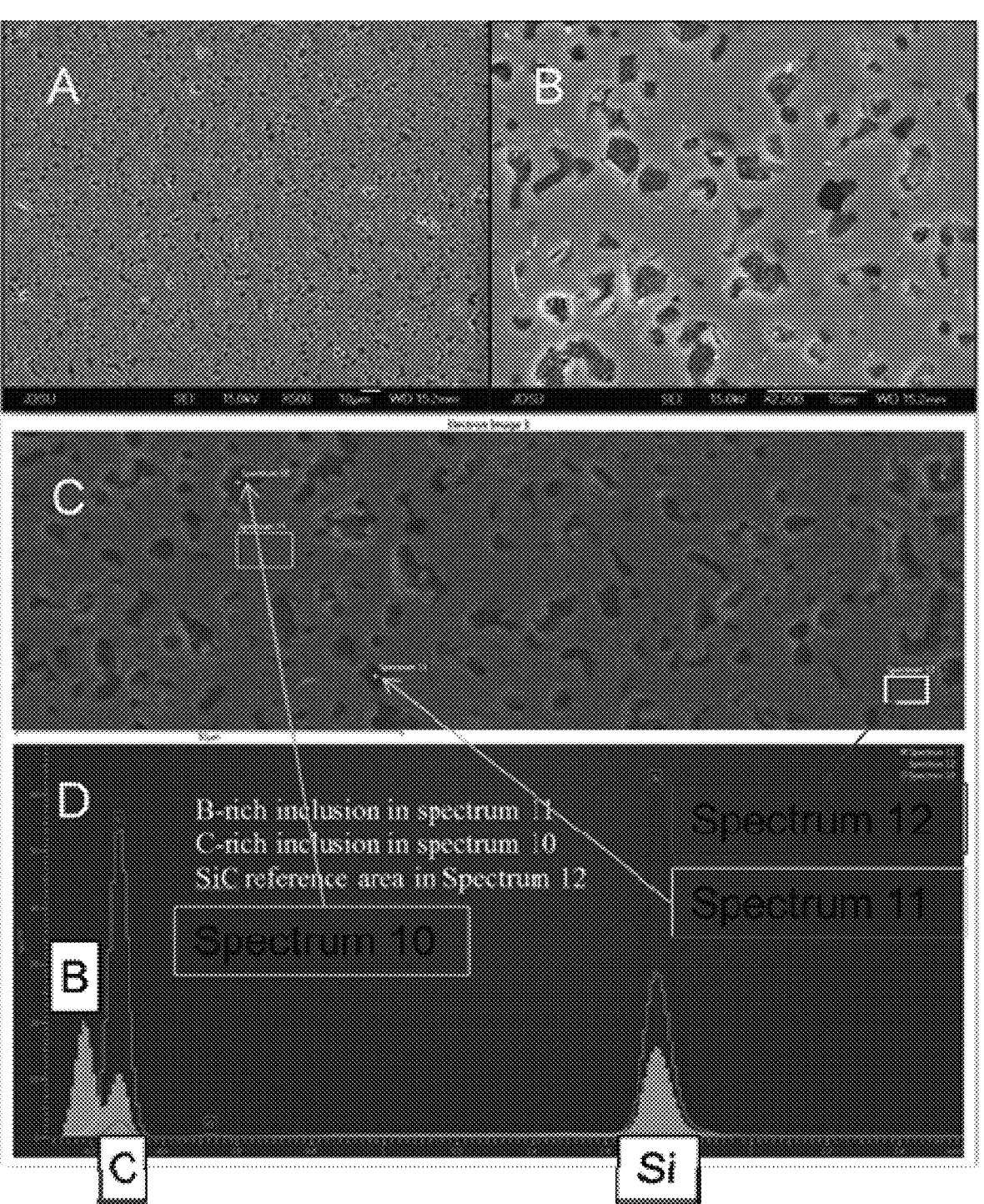
FIG. 9 illustrates target material SEM cross sectioned at A) 500× and B) 2500×, C) SEM cross section of EDS scan with several areas of interest highlighted, and D) EDS scan of various regions with target cross section according to an example of the present disclosure.

The SiC films deposited with different Ar and $H_2$ gas flows all had similar C/Si ratios. Table 4 includes the Ar and $H_2$ flows used for the films that were analyzed with EDS and the analysis of a sample of the target. The C/Si results for the target differed significantly from those of the deposited films. FIG. 9 is an image of the target material analyzed. The target material was very porous and included many large inclusions that were Boron and Carbon rich.

As can be seen in Table 4, a significant amount of Cu was present in the SiC films. This was not expected. Analysis of the target found no Cu in the target material. This led to a separate set of experiments to identify the source of contamination. It was eventually determined that the Cu contamination originated from the Cu coated center puck of the cathode.

TABLE 4

| Spectrum | C | O | Si | Ar | Cu | Ge | C/Si | Ar SCCM | $H_2$ SCCM |
|----------|------|------|-------|------|------|------|------|---------|-----------|
| U07335 | 53.76 | 0.45 | 44.20 | 0.14 | 1.02 | 0.37 | 1.22 | 204 | 0 |
| U07336 | 54.34 | 0.45 | 44.16 | 0.10 | 0.45 | 0.43 | 1.23 | 390 | 0 |
| U07337 | 54.36 | 0.38 | 44.02 | 0.11 | 0.66 | 0.41 | 1.23 | 295 | 0 |
| U07338 | 54.27 | 0.52 | 43.69 | 0.23 | 0.87 | 0.42 | 1.24 | 204 | 40 |
| U07340 | 54.52 | 0.39 | 43.36 | 0.23 | 0.94 | 0.55 | 1.26 | 204 | 80 |
| Target | 71.89 | — | 28.11 | — | — | — | 2.58 | — | — |

TEM Analysis

Figure 10:
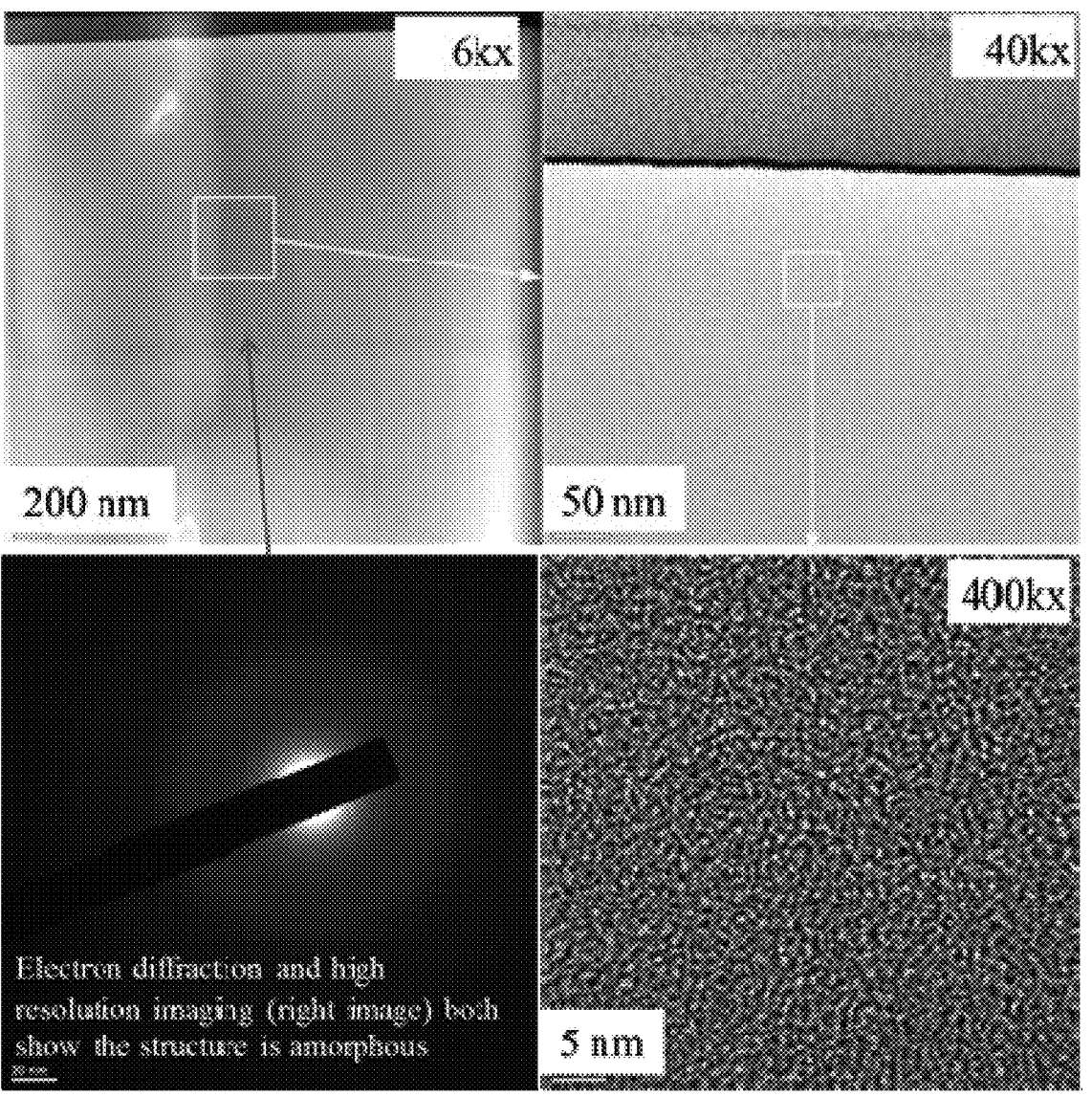
FIG. 10 illustrates SiC sample cross sectioned and imaged in TEM at increasing magnification according to an example of the present disclosure.

SiC films deposited on Ge substrates were cross sectioned and analyzed with TEM to determine film morphology. TEM images at increasing magnification for the cross sectioned sample are shown in FIG. 10. The TEM images indicate that the SiC films were amorphous.

Surface Roughness Measurements 100 nm and 2000 nm thick SiC films deposited on polished Si wafers were used for surface roughness measurements using atomic force microscopy (AFM). The average roughness measured for 2000 nm thick films was 2.6 Å and the average roughness for 100 nm thick films was 1.1 Å. The results are summarized in Table 5 where center and edge are locations on the wafer respectively.

TABLE 5

| | | Surface Roughness | | |
| Sample | Thickness (nm) | Area | RMS (nm) | Ra (nm) |
|---|---|---|---|---|
| U07513 | 2000 | Center | 0.36 | 0.27 |
| U07513 | 2000 | Edge | 0.36 | 0.26 |
| U07517 | 100 | Center | 0.14 | 0.12 |
| U07517 | 100 | Edge | 0.13 | 0.11 |

Film Stress Measurements 100 nm and 2000 nm thick SiC films were deposited on pre-characterized fused silica stress wits for stress measurements. The film stress was highly compressive, −1.5--1.8 GPa for the 2000 nm film and −1.8 GPa for the 100 nm films. A summary of the film stress measurements are shown in Table 6 where center and edge are the locations within the 200 mm UCP tooling.

TABLE 6

| | | Stress (MPa) | |
| Sample | Thickness (nm) | Center | Edge |
|---|---|---|---|
| U07513 | 2000 | −1713 | −1490 |
| U07517 | 100 | −1835 | −1789 |

Hardness Measurements
Single Layer UCP Films

Figure 11:
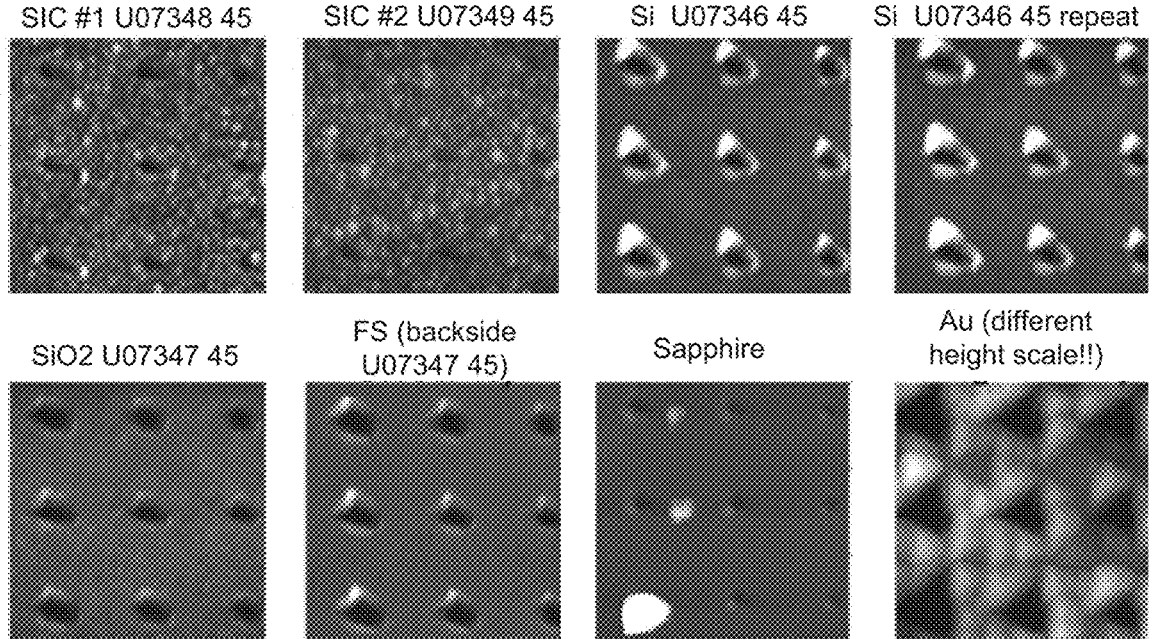
FIG. 11 illustrates AFM images of impressions created by the nano-indenter for SiC, Si, and $SiO_2$ UCP films, fused silica and sapphire substrate and Au reference film according to an example of the present disclosure.

2 μm thick films of SiC, Si and SiO$_2$ were deposited on fused silica and compared to fused silica and sapphire substrates in a measurement of relative hardness. The samples were indented with three known loads and the impressions created by the indentation were measured by AFM. From these measurements, a plot of indentation depth vs indentation load was created for sapphire and fused silica substrates and the SiO$_2$, Si and SiC coatings. These measurements do not provide absolute hardness values, but provide a measure of relative hardness. The results are summarized in FIG. 11. FIG. 11 shows AFM images of the impressions created by the nano-indenter. The SiC films had a similar indentation depth to the sapphire substrate. The Si and SiO$_2$ films and the fused silica substrate all had an indentation depth more than twice as large as SiC and sapphire.

Hardness Analysis of SiC Film on Previously Coated Long-Wave Infrared (LWIR) Design The absorption of SiC in the 7-11 μm IR wavelengths led to further testing of the hardness of thinner SiC films. Film thicknesses of 5, 50, and 100 nm were deposited on fused silica witnesses and then indented with the nano-indenter. SiC films with thicknesses of 50 nm and 100 nm performed similarly to the 2000 nm film previously deposited. The 5 nm film did not perform well and did not increase the hardness of the fused silica substrate. This 5 nm SiC film was also deposited on an infrared anti-reflective (IR AR) coating and submitted for eraser rub testing. The addition of the 5 nm SiC film did not improve the eraser rub performance of the LWIR AR coating, with the IR coating failing immediately or nearly immediately with or without the added 5 nm thick SiC coating.

Cathode Tilting Experiments
Ar Flow Only

An objective of these experiments was the deposition of SiC films for use as a high index material in the visible region. All films deposited to this point, were absorbing in the visible region. One possible explanation for the absorbing films was the extra carbon in the target. The target was fabricated with additional carbon to enable DC sputtering. The surplus carbon in the target was sputtered into the growing film resulting in non-stoichiometric films (as presented in the EDS results in Table 4). To investigate the impact of the extra carbon content on the optical properties of SiC, films were deposited with two cathodes sputtering at the same time, using SiC and Si targets.

Figure 12:
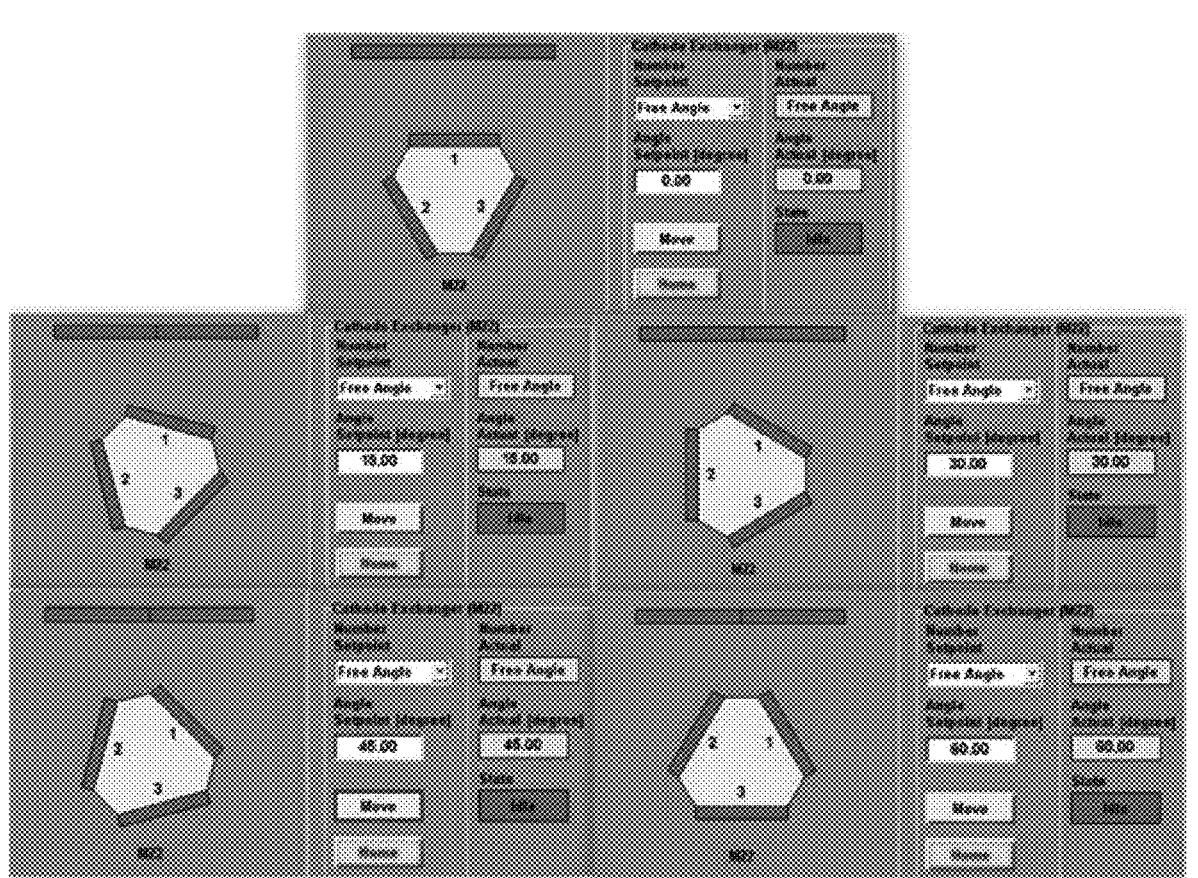
FIG. 12 illustrates cathode angles used for two cathode sputtering at angles 0°, 15°, 30°, 45°, and 60°, SiC being Target 1 and Si being target 2 according to an example of the present disclosure.
Figure 13:
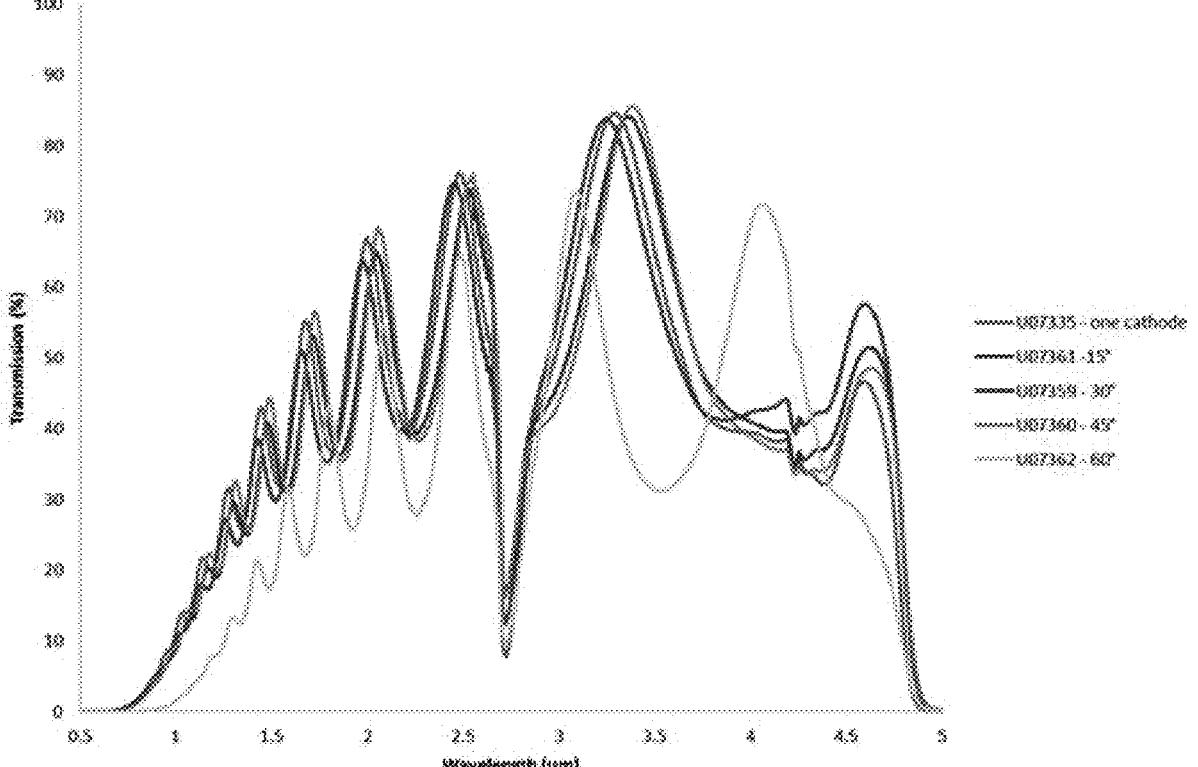
FIG. 13 is a graph showing transmission measurements of SiC films deposited with two cathode sputtering of SiC and Si according to an example of the present disclosure.
Figure 14:
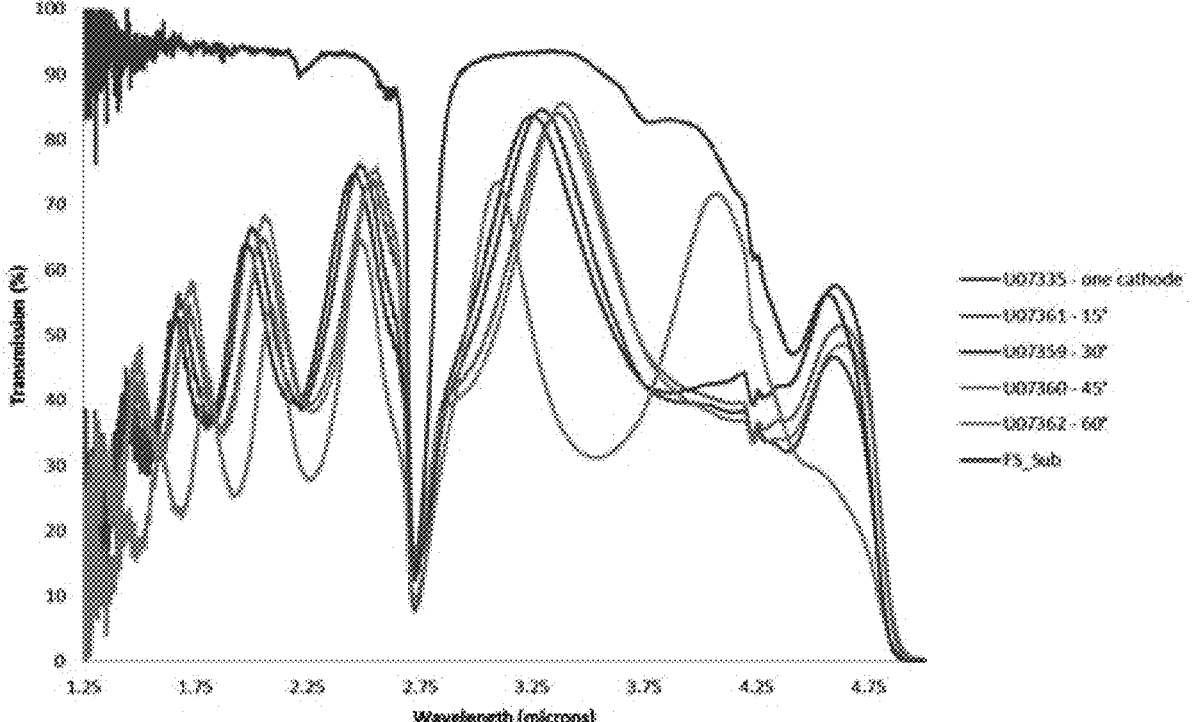
FIG. 14 is a graph showing transmission measurements of SiC films deposited on Si with two cathode sputtering of SiC and Si according to an example of the present disclosure.

SiC and Si targets were placed in cathode positions 1 and 2 in M2105. This configuration is illustrated in FIG. 12. All other sputtering parameters were maintained at single cathode set points, 5 kW, 30 kHz, 4.5 μs and 204 SCCM Ar. The targets were powered simultaneously and the cathode exchanger was set to different deposition angles. A summary of all of the angles used is shown in FIG. 12. Runs U07351-U07357 were designed to test the deposition rate by measuring the physical thickness with the stylus profilometer for the co-sputtering using the two cathodes. The results are summarized in Table 7. In the dual cathode sputtering configuration, the power from the power supply was split between the two cathodes. This resulted in a 50% decrease in the deposition rate for a tilt angle of 0° as compared to single cathode sputtering in the same configuration. At the tilt angle of 0° the Si target was pointed at a downward angle in the machine. No deposition from this cathode was expected to reach the substrate surface. Transmission scans of the dual cathode films are shown in FIGS. 13 and 14. U07364 was deposited with an addition of 80 SCCM Hz.

TABLE 7

| Run | Design | Dep Rate (nm/s) | H$_2$ SCCM | Angle |
|---|---|---|---|---|
| U07359 | SiC__2000 nm | 0.14 | 0 | Angle 30, 1 + 2 on |
| U07360 | SiC__2000 nm | 0.12 | 0 | Angle 45, 1 + 2 on |
| U07361 | SiC__2000 nm | 0.17 | 0 | Angle 15, 1 + 2 on |
| U07362 | SiC__2000 nm | 0.17 | 0 | Angle 60, 1 + 2 on |
| U07364 | SiC__2000 nm | 0.14 | 80 | Angle 30, 1 + 2 on |

The two cathode sputtering did not have a significant impact on the transmission measurements in the visible region for the deposited films. A summary of the EDS results of these films is included in Table 8. As expected the C/Si ratio decreased as the Si cathode was tilted more toward the substrate. The initial EDS C/Si ratio of 1.40 decreased to 1.0 for cathode angle of 45°. The films contained trace amounts of oxygen as well as copper and germanium.

TABLE 8

| Spectrum | Cathode Angle | C | O | Si | Cu | Ge | C/Si |
|---|---|---|---|---|---|---|---|
| U07358 | Angle 0 | 57.31 | 0.79 | 40.84 | 0.89 | 0.17 | 1.40 |
| U07361 | Angle 15 | 57.44 | 0.61 | 40.86 | 1.06 | 0.03 | 1.41 |
| U07359 | Angle 30 | 56.21 | 0.94 | 41.54 | 1.30 | 0.01 | 1.35 |
| U07360 | Angle 45 | 48.08 | 1.34 | 49.59 | 0.96 | 0.02 | 0.97 |
| U07362 | Angle 60 | 28.21 | 1.81 | 69.28 | 0.65 | 0.05 | 0.41 |
| U07364 | Angle 30; 80 SCCM H2 | 56.14 | 0.67 | 41.71 | 1.31 | 0.17 | 1.35 |

Cathode Tilting Experiment—With H$_2$

Figure 15:
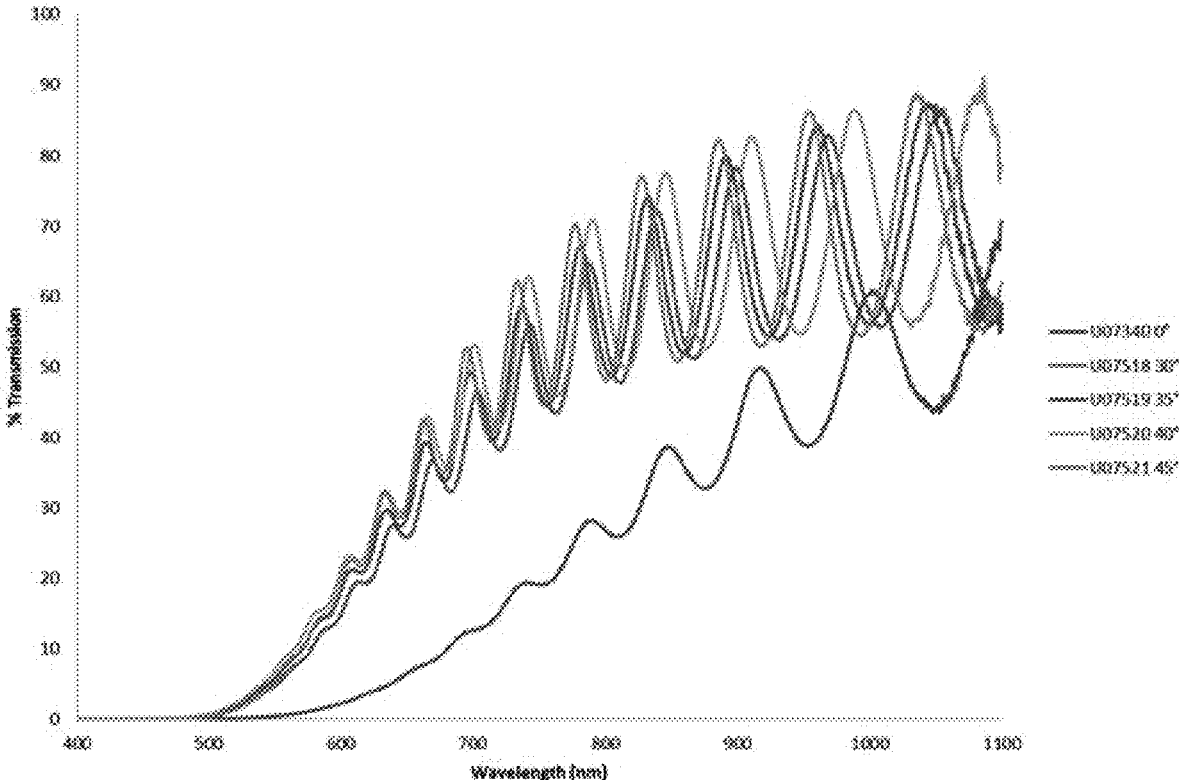
FIG. 15 is a graph showing transmission measurements of SiC films deposited with two cathode sputtering at angles 0°, 30°, 35°, 40°, and 45° with 80 SCCM of $H_2$ according to an example of the present disclosure.

The addition of H$_2$ to single cathode sputtering improved the transmission of the films, so the dual cathode sputtering experiments were repeated with H$_2$ gas in the plasma. Cathode tilt angles of 30, 35, 40 and 45° were selected and 80 SCCM of H$_2$ was used. All other sputtering parameters remained the same as previous depositions. The transmission scans of the 4 films are shown in FIG. 15. The addition of H$_2$ did increase the transmission of the sputtered films;

however, the films were still absorbing in the visible region. It is concluded that SiC deposition from the Hexoloy SG SiC target will not produce films with sufficient transmission for use in the visible region. For the NIR, the transmission increased significantly as the cathode angle was tilted from 0 to 30°. The transmission scans show little difference between the different cathode angles, with these differences partly attributed to differences in coating thickness. The addition of $H_2$ gas did not significantly contribute to the film properties in the IR at wavelengths greater than 2 micrometers with the co-sputtering of SiC and Si cathodes.

Figure 16:
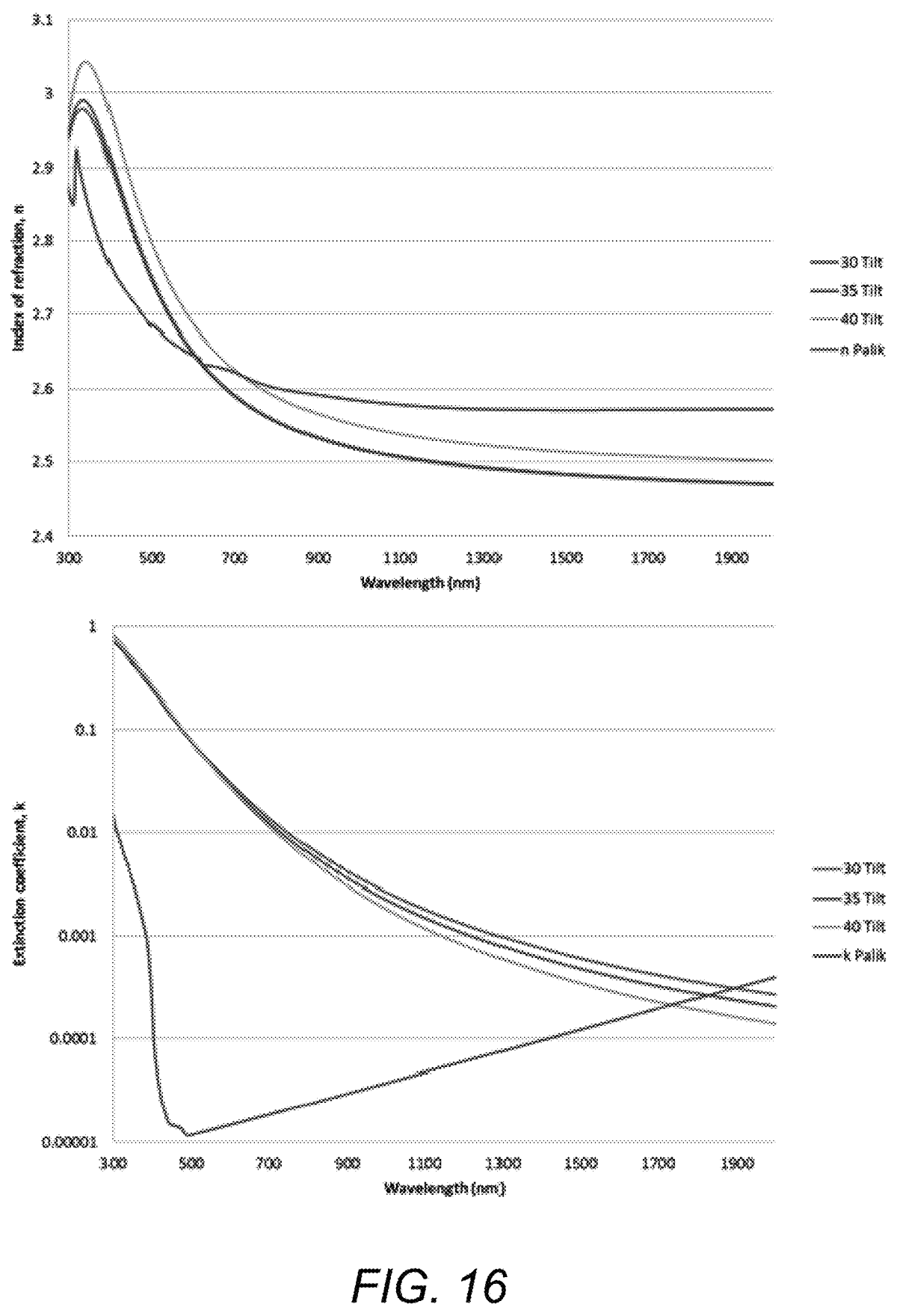

VASE analysis of the three films deposited with 30°, 35° and 40° of tilt is shown in FIG. 16. The n and k values for all three films decreased when compared to the films deposited with single cathode sputtering. The n values for the three films ranged from 3.0 at 400 nm to 2.5 at 2000 nm. The k values ranged from 0.8 at 400 nm to $1.5 \times 10-4$ at 2000 nm. The films did not include a linear index gradient as seen in the previously measured single cathode films.

Film Contamination

Figure 17:
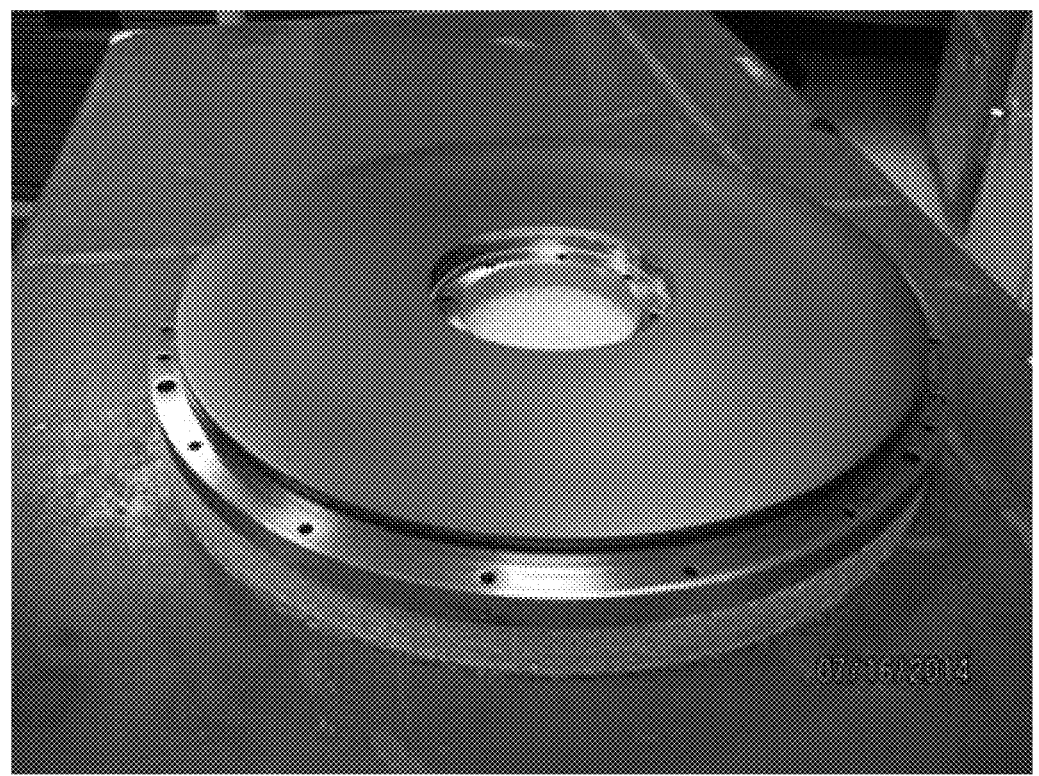
FIG. 17 is an image of SiC target after 160 kWh of use according to an example of the present disclosure.

FIG. 17 is an image of the SiC target after approximately 160 kWh of use. The target surface was smooth, with no noticeable cracks. The inner ring of the target had a buildup on the surface that was not consistent with the deposited film. The material was readily removed with scotch tape and a sample was given to the MCL for analysis. EDS scans of the material from the center of the cathode resulted in a combination of SiC, stainless steel and Cu. The relative concentrations of the stainless steel and Cu varied depending on the location of the EDS scan.

Figure 18:
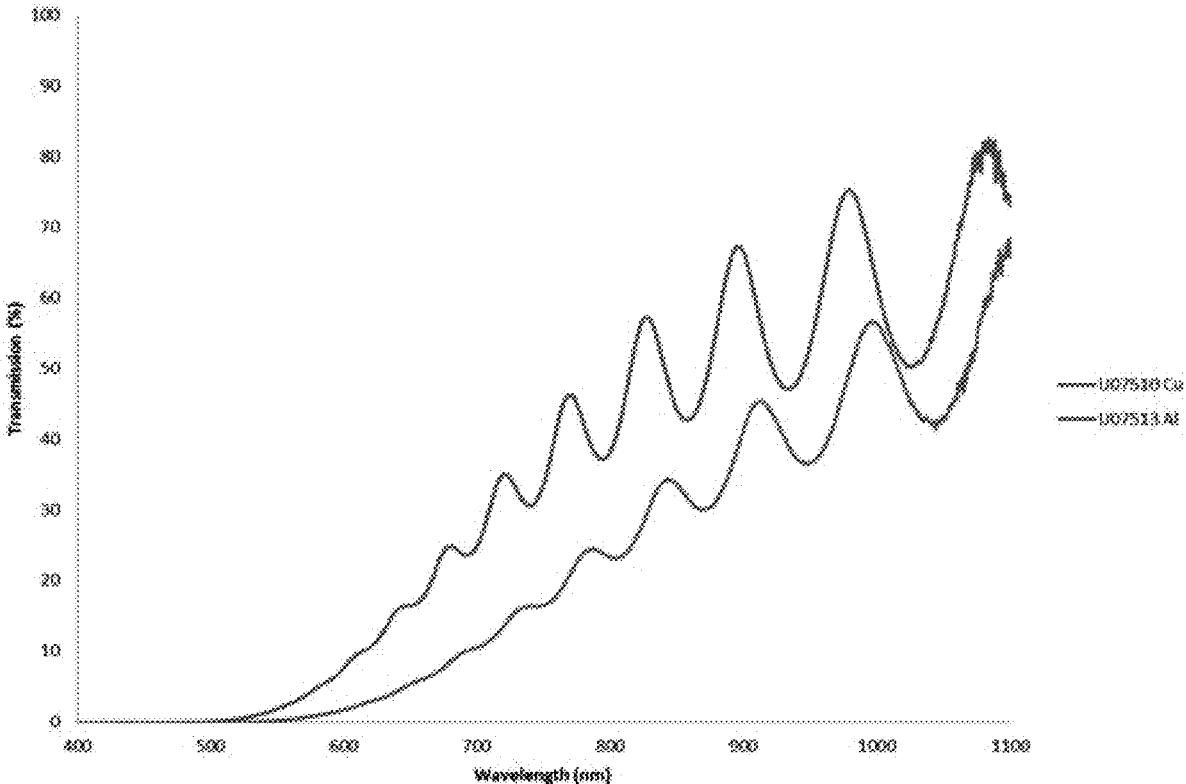
FIG. 18 is a graph showing differences in transmission measurements for 2 μm SiC films deposited with Cu and Al coated center pucks respectively according to an example of the present disclosure.

Cu contamination in optical coatings can lead to significant absorption. A possible source of contamination was identified as the center puck of the cathode. The center pucks for the UCP cathodes had recently changed from Al to ones which are coated with Cu. The Cu coated center puck was removed from the cathode and replaced it with an old Al coated one. A SiC film was deposited with the same deposition conditions before and after the swap and compared the transmission scans. FIG. 18 shows the transmission scans resulting from those two runs, with the Cu coated center puck exhibiting lower transmission in the visible region. At this point all center pucks in UCP were switched back to Al coated and the Cu coated ones were removed from circulation. The removal of the Cu contamination from the film improved the transmission of the films in the visible region, but it did not lead to the high levels at shorter wavelengths. Table 9 includes the EDS data for the two different center pucks. The presence of Cu and Al in the two coating runs indicated that material of the center puck was ending up in the films.

TABLE 9

| Spectrum Label | U07510 | U07513 |
|---|---|---|
| C | 57.97 | 59.05 |
| O | 0.71 | 0.59 |
| Al | 0.00 | 0.14 |
| Si | 39.63 | 39.29 |
| Ar | 0.22 | 0.22 |
| Cu | 0.98 | 0.00 |
| Ge | 0.49 | 0.72 |
| C/Si | 1.46 | 1.50 |

From the foregoing description, those skilled in the art can appreciate that the present teachings can be implemented in a variety of forms. Therefore, while these teachings have been described in connection with particular aspects and examples thereof, the true scope of the present teachings should not be so limited. Various changes and modifications may be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a device can be dynamic in its use an operation, this disclosure is intended to encompass the equivalents, means, systems and methods of the use of the device and/or article of manufacture and its many aspects consistent with the description and spirit of the operations and functions disclosed herein. The claims of this application are likewise to be broadly construed.

The description of the inventions herein in their many aspects is merely an example and, thus, variations that do not depart from the gist of the invention are intended to be within the scope of the invention. Such variations are not to be regarded as a departure from the spirit and scope of the invention.

We claim:

1. A method for depositing a film comprising:
   introducing, to a process chamber of a cathode sputter-deposition system, a first target including a high refractive index material having a refractive index that is 2.18 or higher at a wavelength of 550 nm;
   introducing hydrogen gas into the process chamber;
   sputtering the first target in the presence of hydrogen gas;
   depositing particles created from the sputtering of the first target onto a substrate to form a film; and
   after forming the film, annealing the film at a temperature ranging from greater than 90° C. to less than 300° C. to 350° C. for a time period ranging from 30 minutes to 24 hours,
   wherein after annealing the film exhibits increased transmission of light in near infrared wavelengths compared to a film formed by the same process except that the film is not annealed.

2. The method of claim 1, wherein the film exhibits increased transmission of light in visible wavelengths.

3. The method of claim 1, wherein hydrogen gas is the only gas introduced into the process chamber.

4. The method of claim 1, wherein both argon gas and hydrogen gas are introduced into the process chamber.

5. The method of claim 1, further comprising introducing into the process chamber a second target including silicon.

6. The method of claim 1, further comprising tilting a cathode exchanger in the cathode sputter-deposition system to a tilt angle selected from the group consisting of 30°, 35°, 40°, and 45°.

7. The method of claim 1, further comprising tilting a cathode exchanger in the cathode sputter-deposition system, wherein tilting the cathode exchanger to a tilt angle ranging from greater than 0° to about 30° increases light transmission of the film compared to a film formed by the same process except that the cathode exchanger is not tilted.

8. The method of claim 1, wherein the hydrogen gas was introduced in an amount ranging from about 20 SCCM to about 100 SCCM.

9. The method of claim 1, wherein the high refractive index material is selected from $TiO_2$, $Nb_2O_5$, SiC, $Ta_2O_5$, and combinations thereof.

10. The method of claim 9, wherein the high refractive index material is silicon carbide.

11. The method of claim 1, further comprising tilting a cathode exchanger in the cathode sputter-deposition system, wherein the cathode sputter-deposition system includes the first target of silicon carbide, a second target of silicon, introduced hydrogen gas, and a cathode exchanger tilt angle ranging from greater than 0° to about 30°.

12. The method of claim 1, wherein the high refractive index material has a refractive index within a range of 2.18 to about 2.66 at a wavelength of 550 nm.

13. The method of claim 1, wherein prior to the annealing, the film exhibits increased transmission of light in near infrared wavelengths compared to a film formed by the same process except in the absence of hydrogen gas.

14. The method of claim 1, wherein the annealing the film at the temperature occurs for a time period ranging from 40 minutes to 10 hours.

15. The method of claim 14, wherein the temperature ranges from 200° C. to 280° C.

16. A method for depositing a film comprising:

introducing, to a process chamber of a cathode sputter-deposition system, a first target including a high refractive index material having a refractive index that is 2.18 or higher at a wavelength of 550 nm;

introducing hydrogen gas into the process chamber;

sputtering the first target in the presence of hydrogen gas;

depositing particles created from the sputtering of the first target onto a substrate to form a film; and after forming the film, annealing the film at a temperature ranging from greater than 90° C. to 280° C. for a time period ranging from 30 minutes to 24 hours, wherein after annealing the film exhibits increased transmission of light in near infrared wavelengths compared to a film formed by the same process except that the film is not annealed.

\* \* \* \* \*